United States Patent
Cok et al.

(10) Patent No.: US 7,948,172 B2
(45) Date of Patent: May 24, 2011

(54) LED DEVICE HAVING IMPROVED LIGHT OUTPUT

(75) Inventors: Ronald S. Cok, Rochester, NY (US); Michael E. Miller, Honeoye Falls, NY (US)

(73) Assignee: Global OLED Technology LLC, Herndon, VA (US)

(*) Notice: Subject to any disclaimer, the term of this patent is extended or adjusted under 35 U.S.C. 154(b) by 267 days.

(21) Appl. No.: 11/863,412

(22) Filed: Sep. 28, 2007

(65) Prior Publication Data
US 2009/0085478 A1 Apr. 2, 2009

(51) Int. Cl.
*H01J 1/62* (2006.01)
*H01J 63/04* (2006.01)

(52) U.S. Cl. ........ 313/506; 313/483; 313/503; 313/504; 313/505

(58) Field of Classification Search .................... None
See application file for complete search history.

(56) References Cited

U.S. PATENT DOCUMENTS

| | | | |
|---|---|---|---|
| 5,554,911 A | 9/1996 | Nakayama et al. | |
| 5,949,187 A | 9/1999 | Xu et al. | |
| 6,384,529 B2 | 5/2002 | Tang et al. | |
| 6,680,570 B2 | 1/2004 | Roitman et al. | |
| 6,791,261 B1* | 9/2004 | Shimoda et al. | 313/506 |
| 6,861,800 B2 | 3/2005 | Tyan et al. | |
| 6,919,681 B2 | 7/2005 | Cok et al. | |
| 6,987,355 B2 | 1/2006 | Cok | |
| 7,030,553 B2 | 4/2006 | Winters et al. | |
| 7,859,188 B2* | 12/2010 | Cok et al. | 313/506 |
| 2005/0073228 A1 | 4/2005 | Tyan et al. | |
| 2006/0066228 A1 | 3/2006 | Antoniadis et al. | |
| 2006/0232202 A1 | 10/2006 | Matsuda et al. | |
| 2010/0237333 A1* | 9/2010 | Thomschke et al. | 257/40 |

FOREIGN PATENT DOCUMENTS

DE WO 2008/154908 A 12/2008
EP 1 739 763 A2 1/2007

* cited by examiner

*Primary Examiner* — Nimeshkumar D. Patel
*Assistant Examiner* — Natalie K Walford
(74) *Attorney, Agent, or Firm* — Morgan, Lewis & Bockius LLP

(57) ABSTRACT

A thin-film, white-light-emitting diode device includes a reflective, conductive thin-film structure and a semi-transparent, conductive thin-film structure. One or more thin-film layers are formed between the reflective and semi-transparent conductive thin-film structures to form two or more commonly-controlled microcavity structures. The thin-film layers emit white light in response to current provided by the conductive thin-film structure. Each of the two or more commonly-controlled microcavity structures has a different resonant frequency within one or more optical cavities and emits light with a smaller spectral range than the spectral range of the white-light-emitting thin-film layer(s). A combination of light emitted from the two or more commonly-controlled microcavity structures is white.

18 Claims, 13 Drawing Sheets

1

LED DEVICE HAVING IMPROVED LIGHT OUTPUT

FIELD OF THE INVENTION

The present invention relates to light-emitting diode (LED) devices, and more particularly, to LED device structures for improving light output, manufacturability, and angular performance.

BACKGROUND OF THE INVENTION

Emissive flat-panel display devices are widely used in conjunction with computing devices and in particular with portable devices. These displays are often used in public areas with significant ambient illumination and are viewed from a wide variety of angles. Such devices are also under development as area illumination devices or lamps.

Light emitting diodes (LED) incorporating thin films of light-emitting materials have many advantages in a flat-panel display device and are useful in optical systems. Such films can comprise either or both organic and inorganic materials. U.S. Pat. No. 6,384,529 issued May 7, 2002 to Tang et al. shows an OLED color display that includes an array of OLED light emitting elements (pixels). Light is emitted from a pixel when a current is passed through an organic material, the frequency of the light depending on the nature of the organic material that is used. The organic materials are placed upon a substrate between electrodes, with an encapsulating cover layer or plate. In such a display, light can be emitted through the substrate (a bottom emitter) or through the encapsulating cover (a top emitter), or both. The emitted light is Lambertian, that is it is emitted equally in every direction. Because LED devices employ high-optical-index emissive materials, a large fraction (e.g. greater than 50%) of the emitted light is trapped in the device due to total internal reflection and thus reduces the device efficiency. Inorganic materials, for example, may include phosphorescent crystals or quantum dots. Other thin films of organic or inorganic materials may also be employed to control charge injection, transport, or blocking to the light-emitting-thin-film materials, and are known in the art.

Optical cavity structures are known to increase the light emitted from an LED device structure. Such optical cavity structures are also known as microcavities or optical microcavities when formed in thin films. When formed in LED devices, different color light-emitting organic materials are pattern-wise deposited over a substrate between a reflective electrode and a semi-transparent electrode. Light emitters having different colors are formed by depositing light-emitting organic or inorganic materials within an optical cavity that is tuned to a desired peak wavelength of light, typically corresponding to the color of light emitted by the patterned light-emitting materials. U.S. Pat. No. 6,680,570 describes an organic light-emitting device with improved color control employing spacer layers to form an optical cavity. FIG. 9 illustrates such a prior-art, active-matrix, bottom-emitting optical cavity device employing a substrate 10 with active-matrix thin-film components 30, planarization structures 32 and 34, and a semitransparent electrode 16. Patterned organic materials 14R, 14G, and 14B providing red, green, and blue light emission are deposited in a light-emitting layer 14. Optical spacers 26R, 26G, and 26B are employed to form optical cavities 60, 62, and 64 tuned to the desired peak wavelengths of red, green, and blue light, respectively to emit red light 80, green light 82, and blue light 84. A cover 20 can be employed to protect and encapsulate the device. While such designs are useful, they require a patterned organic material deposition technology (for example, vacuum deposition through metal shadow-masks) that is difficult to scale to large substrates. Moreover, optical cavity devices typically suffer from an unacceptable angular color dependence. It is also known to employ a color filter with an optical cavity structure, for example as taught in U.S. Pat. No. 7,189,238. However, while useful, such an approach does not improve the manufacturability of the device and provides inadequate ambient contrast ratio under some illumination conditions. Moreover, the color filters absorb light emitted from the light-emitting layer, thereby reducing device efficiency.

U.S. Pat. No. 5,554,911 entitled "Light-emitting elements" describes a multi-color light-emitting element having at least two optical cavity structures with respectively different optical lengths determining their emission wavelengths. Each optical cavity structure includes an organic material as a light-emitting region, which may be a single film of uniform thickness in the element. U.S. Pat. No. 6,861,800 entitled, "Tuned microcavity color OLED display" describes a microcavity OLED device having an array of pixels divided into at least two different color pixel sets, each color pixel set emitting a different predetermined color light over a common substrate, wherein each pixel in the array includes a metallic bottom-electrode layer disposed over the substrate and a separate semitransparent metallic electrode layer spaced from the metallic bottom-electrode layer. The material for the semitransparent metallic electrode layer includes Ag, Au, or alloys thereof. The thickness of the semitransparent metallic electrode layer, the combined thickness of the organic layers and the transparent conductive phase-layer, and also the placement of the light-emitting layer are selected so that each pixel in the display forms a tuned microcavity OLED device having emission output efficiency above that of a comparable OLED device without the microcavity. U.S. Pat. No. 5,949,187 describes an OLED with a first microcavity including a first transparent spacer and a first mirror stack positioned on the first spacer to reflect light back into the OLED and to define an optical length of the first microcavity. The optical length of the first microcavity is such that light emitted from the first microcavity has a first spectrum. A second microcavity includes a second transparent spacer positioned adjacent the first microcavity and a second mirror stack positioned on the second spacer reflects light toward the second microcavity and defines an optical length of the second microcavity. The optical length of the second microcavity is such that light emitted from the second microcavity has a second spectrum. Additional microcavities can be placed in the structure to further enhance and alter the light spectrum. Such designs, however, may have increased manufacturing costs, lower light output than desired, and reflectance larger than may be desired, as well as significant color change at different viewing angles, owing to the change in the effective optical path length for light traveling at angles to the normal.

US 2006/0066228 A1 entitled, "Reducing or eliminating color change for microcavity OLED devices", by Antoniadis discloses a microcavity OLED device that minimizes or eliminates color change at different viewing angles. The OLED device can be, for example, an OLED display or an OLED light source used for area illumination. This OLED device includes a multi-layer mirror on a substrate, and each of the layers is comprised of a non-absorbing material. The OLED device also includes a first electrode on the multi-layered first mirror, and the first electrode is substantially transparent. An emissive layer is on the first electrode. A second electrode is on the emissive layer, and the second electrode is substantially reflective and functions as a mirror.

The multi-layer mirror and the second electrode form a microcavity. On a front surface of the substrate is a light modulation thin film. The light modulation thin film can be any one of: a cut-off color filter, a band-pass color filter, a brightness enhancing film, a microstructure that attenuates an emission spectrum at an angle at which there is a perceived color change, or a microstructure that redistributes wavelengths so the outputted emission spectrums have the same perceived color. Again such designs may have increased manufacturing costs due to patterned deposition processes. Also, significant light may be absorbed by the color filters thereby reducing efficiency.

One approach to overcoming material deposition problems on large substrates is to employ a single emissive layer, for example, a white-light emitter, together with color filters for forming a full-color display, as is taught in U.S. Pat. No. 6,987,355 entitled, "Stacked OLED Display having Improved Efficiency" by Cok. However, the use of color filters substantially reduces the efficiency of the device. It is also known to employ a white sub-pixel that does not include a color filter, for example as taught in U.S. Pat. No. 6,919,681 entitled, "Color OLED Display with Improved Power Efficiency" by Cok et al. However, this disclosure does not address angular color issues or the large amount of trapped light.

It is also known to produce white-light emission from a microcavity OLED device. US20050073228 A1 entitled, "White-emitting microcavity OLED device" describes a white light emitting OLED apparatus including a microcavity OLED device and a light-integrating element, wherein the microcavity OLED device has a white-light emitting organic EL element and the microcavity OLED device is configured to have angular-dependent narrow-band emission, and the light-integrating element integrates the angular-dependent narrow-band emission from different angles from the microcavity OLED device to form white-light emission. However, the color or white point of such a design has a strong angular dependence.

U.S. Pat. No. 7,030,553 entitled, "OLED device having microcavity gamut sub-pixels and a within gamut sub-pixel" by Winters et al discloses an example of a microcavity device. This disclosure describes an OLED device including an array of light-emitting pixels, each pixel including sub-pixels having organic layers including at least one emissive layer that produces light and spaced electrodes. There are at least three gamut sub-pixels that produce colors that define a color gamut and at least one sub-pixel that produces light within the color gamut produced by the gamut sub-pixels. At least one of the gamut sub-pixels includes a reflector and a semitransparent reflector, which function to form a microcavity. However, this design employs a patterned semi-transparent electrode to form the white subpixel that can be difficult to manufacture in a top-emitting format. Moreover, angular color change is not addressed in the patent.

There still remains a need, therefore, for an improved light-emitting structure that overcomes shortcomings in the prior art and that increases the light output, angular color performance, and manufacturability of an LED device.

SUMMARY OF THE INVENTION

The present invention addresses the aforementioned need by providing a thin-film, white-light-emitting diode device that has a reflective, conductive thin-film structure and a semi-transparent, conductive thin-film structure. One or more thin-film layers are formed between the reflective and semi-transparent conductive thin-film structures to form two or more commonly-controlled microcavity structures. The thin-film layers emit white light in response to current provided by the conductive thin-film structure. Each of the two or more commonly-controlled microcavity structures has a different resonant frequency within one or more optical cavities and emits light with a smaller spectral range than the spectral range of the white-light-emitting thin-film layer(s). A combination of light emitted from the two or more commonly-controlled microcavity structures is white.

Another aspect of the invention provides that each of the two or more commonly-controlled microcavity structures emits light having a smaller spectral range than the spectral range of the light-emitting thin-film layer(s); and a color change of the combined light emitted by the commonly-controlled microcavity structures over one or more angles is less than the color change of the light emitted by at least one of the commonly-controlled microcavity structures over the one or more angles.

ADVANTAGES

The present invention has the advantage that it increases the light output and manufacturability of an LED device, and reduces any angular color change.

DETAILED DESCRIPTION OF THE INVENTION

Figure 1:
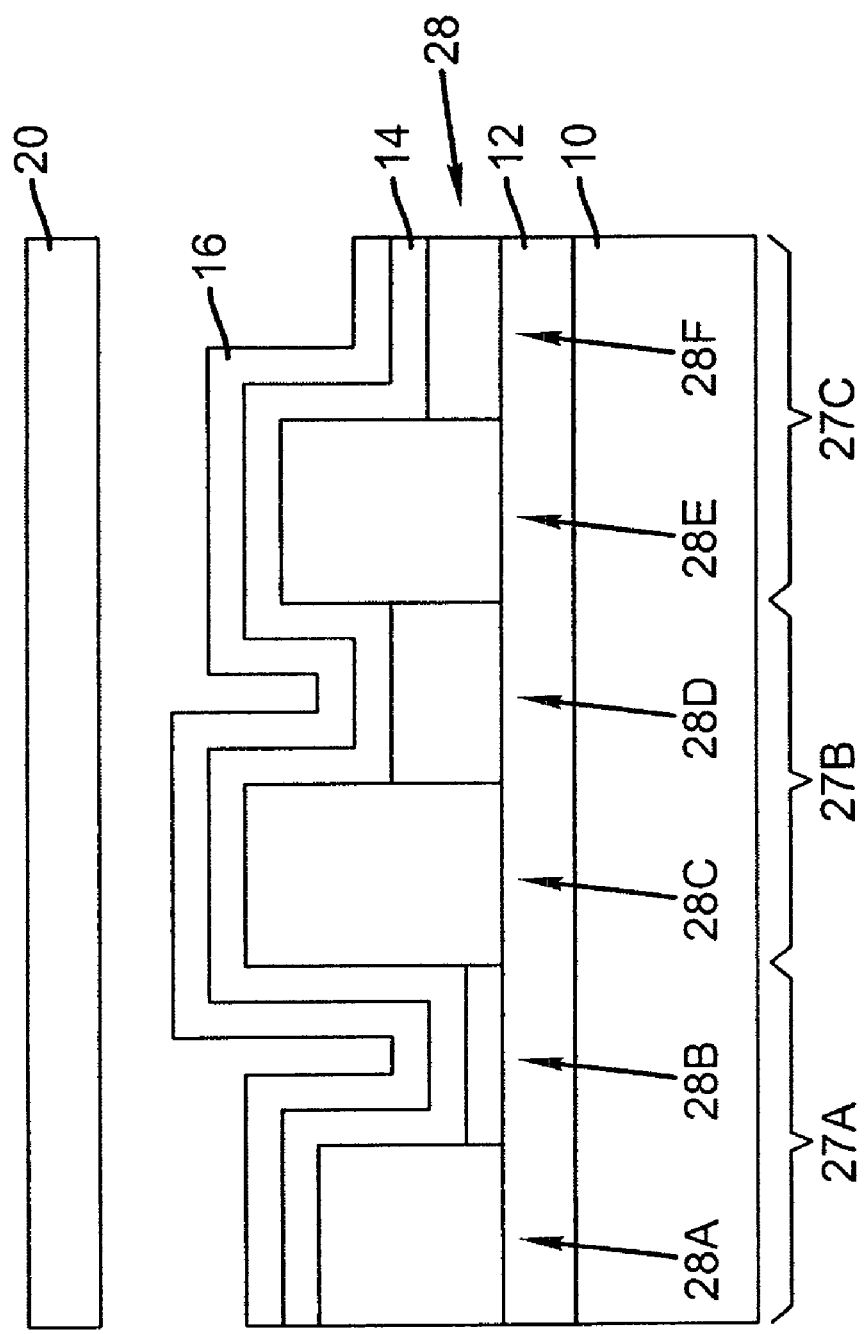
FIG. 1 illustrates a partial cross section of an LED device according to an embodiment of the present invention.

Referring to FIG. 1, a thin-film, white-light-emitting diode device according to the present invention, comprises a reflective, conductive thin-film structure 12 and a semi-transparent, conductive thin-film structure 16. One or more thin-film layers 14 are formed between the reflective and semi-transparent conductive thin-film structures thereby forming two or more commonly-controlled microcavity structures 28. The thin-film layers 14 emit white light in response to current provided by the conductive thin-film structures 12, 16. Each of the two or more microcavity structures 28 emits light having a smaller spectral range than the spectral range of the white-light-emitting thin-film layer(s) 14. The combination of light emitted by the microcavity structures 28 is white. The color change of the combined light emitted by the microcavity structures 28 over a range of angles is less than the color change of the light emitted by at least one of the microcavity structures 28 over the range of angles.

All of the thin-film layers may be formed on a substrate 10. The positions of the reflective, conductive thin-film structure 12 and the semi-transparent, conductive thin-film structure 16 with respect to the substrate 10 and a cover 20 may be reversed, to form a top-emitting or bottom-emitting LED device, both of which are contemplated by the present invention. The thin-film layers, together, emit white light and can include a plurality of individual light-emitting layers, as is known in the art. However, when employed within a microcavity, the emission from the microcavity structure will be colored, due to the constructive and destructive optical interference caused by the microcavity structure.

To further understand this invention, it is useful to understand a number of the terms that are employed. A reflective thin-film structure will typically reflect at least 50% of the radiant energy for at least one desired wavelength or preferably reflect at least 80% of the radiant energy for at least one desired wavelength. However, it will be recognized that it is desirable for such a reflective thin-film structure to reflect even greater than 90% of the radiant energy. A semi-transparent conductive film of the present invention is desired, which has very low absorbance within a desired wavelength range. Such a layer will typically reflect at least 10% of the radiant energy that impinges on it and preferably may reflect significantly more of the radiant energy that impinges upon it over a desired wavelength range. When discussing a range of angles, such angles are typically measured with respect to a vector drawn normal to the substrate, which will often also be normal to the active region of the reflective conductive thin-film structure.

Further, within this disclosure, the term white refers to any color to which a human observer may adapt to and perceive as white. Such colors are often specified with respect to the Planckian Locus within a perceptually relevant color space, such as the 1976 CIE uniform chromaticity diagram. For the purposes of the present invention a color will typically be specified as white if it lies within 0.05 units of the Planckian Locus for blackbody temperatures between 3000 and 20,000 Kelvin when plotted within the 1976 CIE uniform chromaticity diagram.

While unpatterned, white-light emitters may be employed in the present invention, in other embodiments of the present invention the light-emitting layer can be patterned. For example, different light-emitting materials may be employed within different, commonly-controlled microcavity structures. In this case, each of the two or more commonly-controlled microcavity structures emit light having a smaller spectral range than the spectral range of the light-emitting thin-film layer(s). The color change of the combined light emitted by the commonly-controlled microcavity structures over a range of angles is less than the color change of the light emitted by at least one of the commonly-controlled microcavity structures over the range of angles. According to further embodiments of the present invention, the light emitted by at least two of the microcavity structures 28 is complementary. As used herein, complementary light means two frequencies, or frequency ranges, of light that together forms a white light. A pair of microcavity structures 28A and 28B form microcavity structure 27A. One of the microcavity structures 28A in microcavity structure 27A emits yellow light, while the other microcavity structure 28B in microcavity structure 27A emits blue light. Alternatively, for example, one of the microcavity structures 28C in microcavity structure 27B emits magenta light while the other microcavity structure 28D in microcavity structure 27B emits green light. In yet another alternative, for example, one of the microcavity structures 28E in microcavity structure 27C emits red light while the other microcavity structure 28F in microcavity structure 27C emits cyan light. In some embodiments of the present invention, one of the complementary pairs may be employed, e.g. 27A. In another embodiment, two microstructures including complementary pairs (e.g. 27A, 27B) may be employed. In yet another embodiment of the present invention and as shown in FIG. 1, three microcavity structures having complementary pairs (e.g. 27A, 27B, 27C) may be employed. According to one embodiment of the present invention, all of the complementary pairs may be commonly controlled with a single control. According to an alternative embodiment of the present invention, the pairs may be independently controlled, for example with one control for complementary pair associated with microcavity structure 27A, a second control for complementary pair associated with microcavity structure 27B, and third control for complementary pair associated with microcavity 27C.

Figure 2:
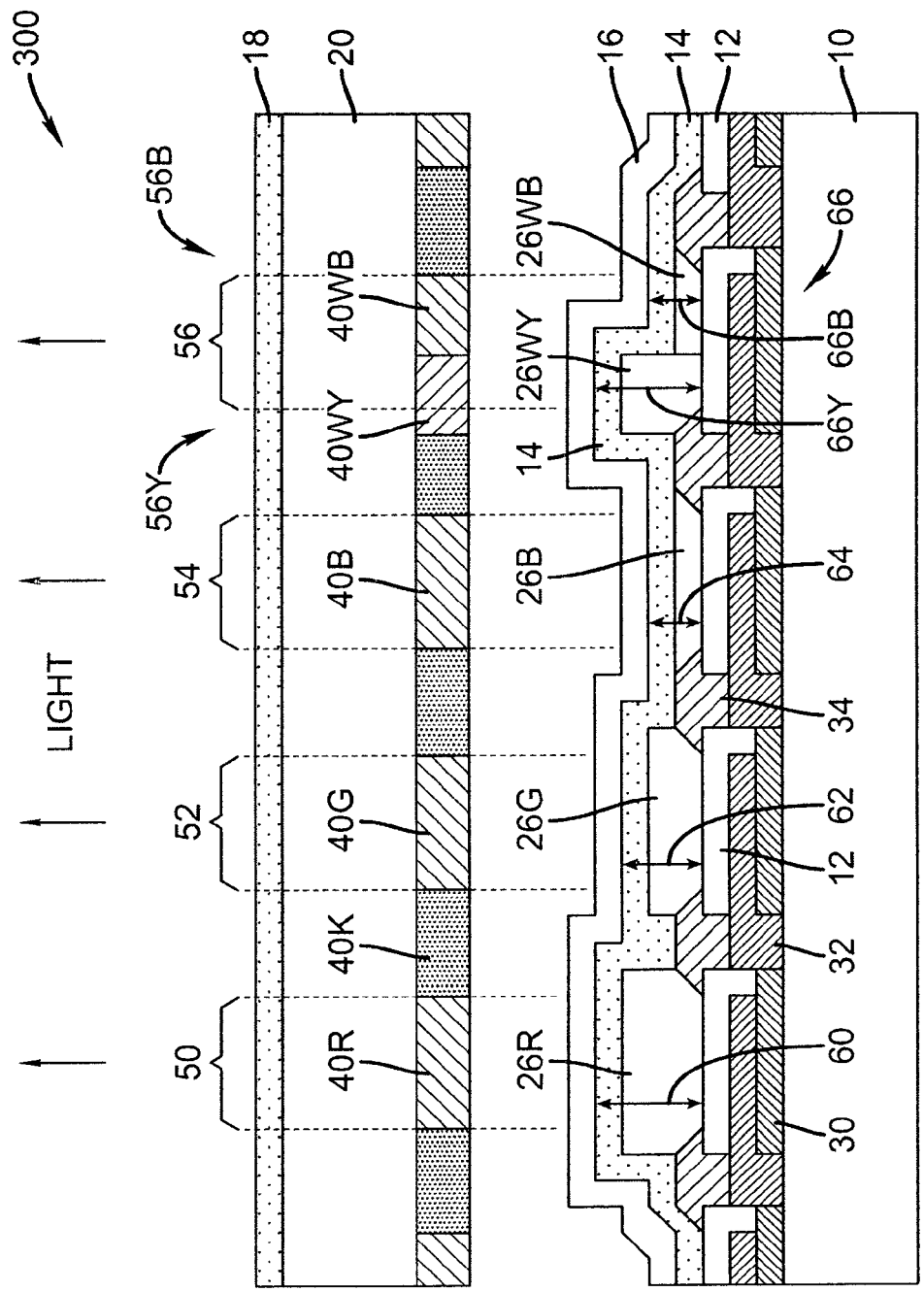
FIG. 2 illustrates a partial cross section of a top-emitter LED device according to an embodiment of the present invention.

In other embodiments of the present invention, further microcavity structures or non-microcavity structures may be employed, with or without color filters. For example, referring to FIG. 2, an exemplary embodiment of a light-emitting diode device according to the present invention comprises a substrate 10, a conductive thin-film structure 12, in this case a reflective electrode formed from a reflective, conductive metal such as aluminum or silver, and a semi-transparent, conductive thin-film structure 16, in this case a semi-transparent electrode formed from a very thin layer of metal, such as silver. The conductive thin-film structure 12 and the semi-transparent, conductive thin-film structure 16 are formed over the substrate 10. At least one of the reflective electrodes or semi-transparent electrodes is patterned to form independently-controllable light-emitting elements 50, 52, 54, and 56. As shown in FIG. 2, for example, reflective electrode 12 is patterned. The independently-controllable light-emitting elements can be controlled, for example by thin-film electronic components 30 formed on the substrate 10. The other electrode 16 can be unpatterned and electrically common to all of the light-emitting elements 50, 52, 54, and 56. An unpatterned white-light-emitting layer 14 is formed between the reflective conductive thin-film structure 12 and the semi-transparent conductive thin-film structure 16 and may include several layers, for example, charge-control layers as are known in the prior art. The reflective conductive thin-film structure 12, semi-transparent conductive thin-film structure 16, and unpatterned white-light-emitting layer 14 form optical cavities 60, 62, 64, and 66. The optical cavity 66 further includes a plurality of commonly-controlled optical microcavities, for example 66Y and 66B, as described below. Several color filters 40R, 40G, and 40B are formed over a side of the semi-transparent conductive thin-film structure 16 opposite the unpatterned white-light-emitting layer 14 in correspondence with the independently-controllable light-emitting elements 50, 52, 54 to form colored sub-pixels. The color filters have at least two different colors. At least one independently-controllable light-emitting element 56 has at least two commonly-controlled portions 56Y, 56B that together emit substantially white light to form a white sub-pixel. The optical cavity 66 of one or more of the commonly-controlled portions 56Y, 56B of the white sub-pixel includes a plurality of optical microcavities 66Y, 66B. Each optical microcavity is tuned to emit light at a different complementary wavelength at a range of emission angles. According to the present invention, the color change of the combined light emitted by the commonly-controlled microcavity structures at a range of angles is less than the color change of the light emitted by at least one of the microcavity structures at the range of angles.

According to one embodiment of the present invention, the reflective, conductive thin-film structure 12 or the semi-transparent, conductive thin-film structure 16 includes a single layer, for example a metal layer such as aluminum, silver, magnesium, or alloys of these metals.

As shown in FIG. 2, the present invention may employ transparent spacer layers 26R, 26G, 26B, and 26W having different thicknesses between the reflective conductive thin-film structure 12 and the light-emissive layer 14 or semi-transparent conductive thin-film structure 16. Such layers may be organic or inorganic, but are desirably highly conductive to reduce voltage across the LED. Alternatively, a resistive, transparent layer may be employed to provide short reduction properties, as is taught in the art. The different thicknesses are chosen to tune the optical response of the different optical cavities 60, 62, 64.

Figure 3A:
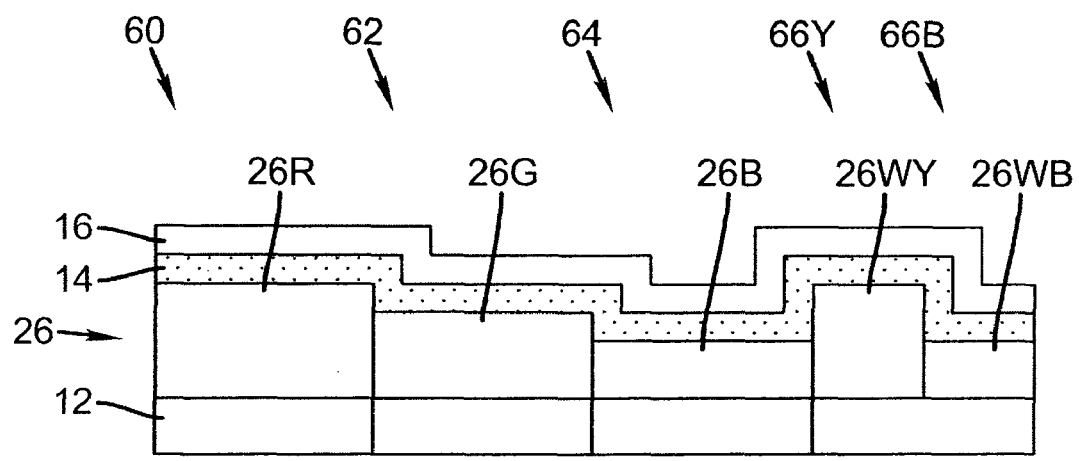
FIGS. 3A and 3B illustrate partial cross sections of a top-emitter LED device having spacers, according to various embodiments of the present invention.
Figure 3B:
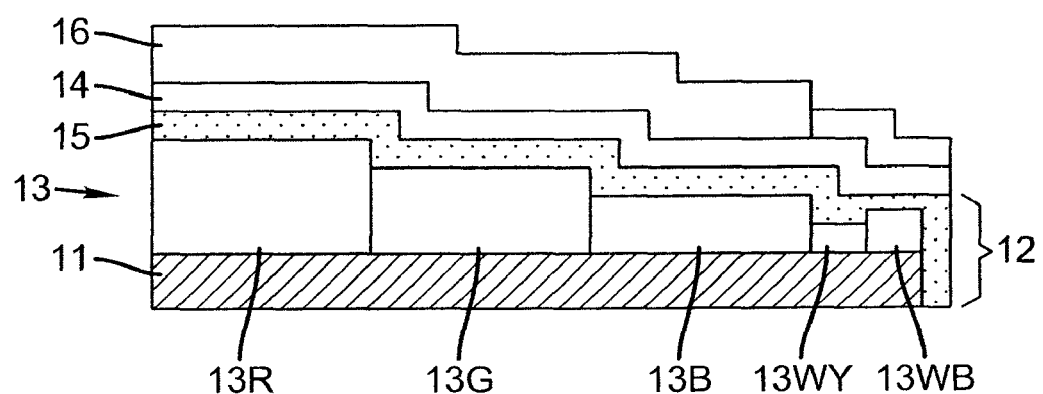

Referring to FIG. 3A, in a more detailed drawing of a portion of FIG. 2, a reflective conductive thin-film structure 12 is formed over a substrate (not shown) together with spacers 26 for optical cavities. Each of the optical cavities 60, 62, 64, 66Y, 66B is tuned with spacers 26R, 26G, 26B, 26WY, 26WB to form optical microcavities, e.g. red, green, blue, blue, and yellow respectively. The thickness of the spacer layers within optical cavities providing similar colors, such as 64 and 66B in this example, may have spacers 26B and 26WB, respectively, that have a common thickness and are formed in a common step. However, this is not required and often it may be desirable for the two spacers to have different thickness to provide different tradeoffs between parameters such as color saturation and efficiency. In an alternative embodiment of the present invention, shown in FIG. 3B, the optical cavities may be tuned by employing transparent spacer layers 13R, 13G, 13B, 13WY, 13WB between a separate reflective layer 11 and a transparent conductive layer 15, the reflective layer 11 and transparent conductive layer 15 also comprising the reflective conductive thin-film structure 12. Conductive or non-conductive, transparent spacer elements 13 can be employed between the reflective layer 11 and the separate transparent, conductive layer 15, for example, silicon dioxide, silicon nitride, or a conductive oxide such as ITO, IZO, or AlZO. Alternatively, a transparent conductive layer 15 can be formed directly over and in electrical contact with a reflective layer 11. The reflective layer 15 is also conductive.

Figure 4:
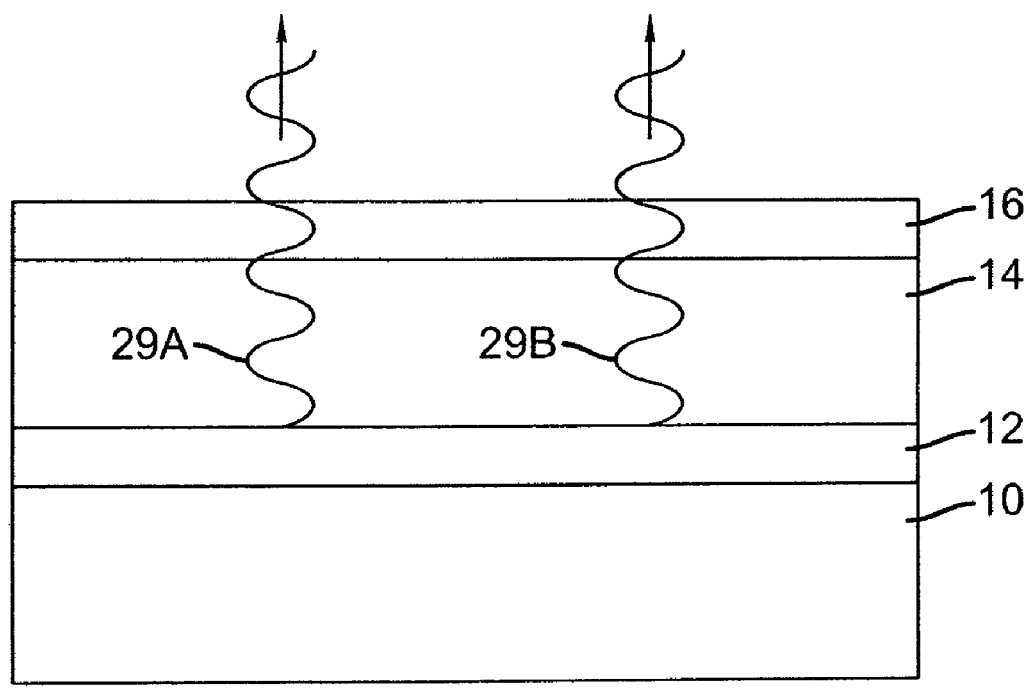
FIG. 4 illustrates an optical microcavity having multiple resonant frequencies useful for various embodiments of the present invention.

In one embodiment of the present invention, the microcavity structures 26 are formed adjacent each other over a substrate (as shown in FIGS. 1 and 2). In an alternative embodiment shown in FIG. 4, first and second microcavity structures are formed in a common cavity resonant at two or more different frequencies 29A and 29B. As employed herein, such an optical cavity resonant at two frequencies is considered to form two optical microcavity structures, each emitting light at one of the resonant frequencies. In particular, such an optical cavity may be resonant at both blue and red frequencies to emit light perceived as magenta light.

The present invention can be employed in an RGBW (red, green, blue, and white) sub-pixel architecture to form individual pixels in an information presentation device, such as a display (FIG. 2). A common, unpatterned white-light emitter 14 is employed. Colored light is formed by a combination of separately tuned microcavities for each color together with color filters 40R, 40G, 40B (for the color sub-pixels). A black matrix 40K can be employed to absorb ambient light between the light-emitting elements 50, 52, 54, 56. Planarizing and insulating layers 32 and 34 can be provided to electrically separate the independently-controllable light-emitting elements. A color filter may not be necessary for the commonly-controllable microcavity structures 56Y, 56B, since the optical microcavities 66Y, 66B form complementary colors. However, in a further embodiment of the present invention and as described below, one or more separate color filters 40WY, 40WB can also be employed together or separately with the commonly-controllable portions 56Y, 56B of the white sub-pixel 56.

Figure 5:
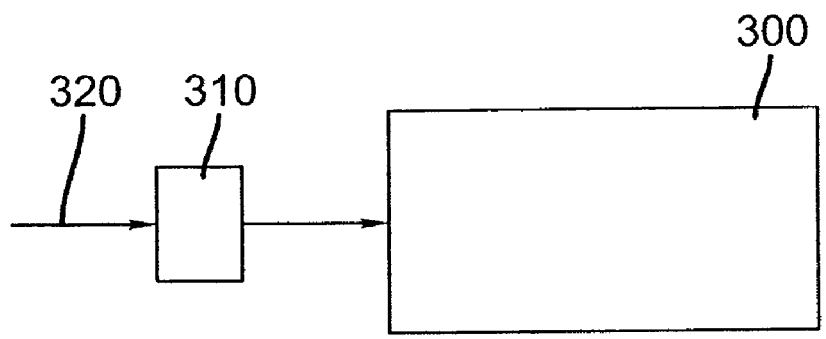
FIG. 5 is a system employing an LED device according to the present invention.

Alternatively, the present invention can be employed to form an area illumination device or lamp. In this latter case, emission at a wide variety of frequencies is necessary to provide a high color rendering index (CRI). Hence, employing complementary microcavity structure pairs having a widely distributed set of frequencies, as shown in FIG. 1, may provide a high-quality white-light source. As shown in FIG. 5, such displays, area illuminators, or lamps can be employed in a light-emission system that includes an LED device 300, together with a controller 310 to control and provide power to the thin-film, white-light-emitting diode device; typically through the reflective, conductive thin-film structure 12 and semi-transparent, conductive thin-film structure 16, which are typically current-carrying electrodes, in response to an information or power signal 320.

Prior-art light-emitting solutions employing thin-film optical cavity structures suffer from a poor white emission and, in particular, a strong tendency to change color when viewed at a variety of angles. As taught in the present invention, however, the commonly-controlled microcavity structures 28 emit light having a smaller spectral range than the spectral range of the white-light-emitting thin-film layer(s) 14. The combination of light emitted by the microcavity structures 28, being substantially white, and the color change of the combined light emitted by the microcavity structures 28, at a range of angles, is less than the color change of the light emitted by at least one of the microcavity structures 28 at the range of angles. Therefore, the present invention provides thin-film optical cavity structures that produce white light with a decreased dependence on angle.

In this disclosure, complementary wavelengths of light are those wavelengths of light that, when viewed together, form a substantially white-appearing light, such as light on or near the Planckian locus. For example, blue and yellow form a complementary pair, as do cyan and red, and green and magenta. Hence, the commonly-controllable optical microcavities 66Y, 66B of the commonly-controllable microcavity structures 56Y, 56B of the white sub-pixel 56 (FIG. 2), when viewed together, emit white light. According to various embodiments of the present invention, the commonly-controlled microcavities are not individually distinguished by the human eye when viewed from a typical viewing distance, for example the commonly-controllable portions 56Y, 56B of the white sub-pixel 56. Hence, the light emitted from the white sub-pixel 56 will be viewed as white, even though the light emitted from the white sub-pixel 56 is actually a combination of complementary colors. For simplicity, FIG. 2 illustrates blue and yellow light-emitting optical microcavities 66Y, 66B, but the present invention is not solely limited to that embodiment.

In operation, current, for example, as supplied through thin-film transistors 30, passes through the light-emitting layer 14 via the thin-film, conductive structures (electrodes) 12 and 16, causing light to be emitted. Some of the emitted light passes directly out of the device or through the color filters and out of the device. Other light is reflected from the reflective electrode 12 and passes out of the device. Other light, emitted at a higher angle to the normal, is trapped via total internal reflection. The optical cavity structures serve to reduce the angle of emission of the emitted light, thereby reducing the amount of trapped light and also focusing more of the desired light in the forward direction. Commonly-controllable microcavity structures 56Y and 56B of a white sub-pixel 56 are driven at the same time with the same electrical controls (e.g. transistors 30) so that they cannot be independently stimulated and, hence represent one sub-pixel, albeit one having different optical components. The present invention may be employed with both active-matrix and passive-matrix control circuits. It should be noted that the relative sizes of the microcavity structures 56Y and 56B of a white subpixel 56 may be adjusted during design and manufacturing, at least in some embodiments, to tune the color of white light emission. Alternatively, different resistors are employed between each of the two microcavity structure 56Y and 56B to adjust the relative current provided to the two microcavity structures and therefore adjust their relative luminance.

In particular, the present invention provides a means to form a substantially white light that is viewed as white at a variety of angles from the normal. The light output from each optical microcavity 66Y, 66B increases in frequency (and decreases in wavelength) as the angle at which the light is emitted increases from the normal (90 degrees) with respect to the substrate. According to the prior art, a conventional, single-element white emitter would tend to become substantially bluer and, especially greener, since the human visual system is most sensitive to green and all of the frequencies of white light emitted by the white sub-pixel are increased at the increased viewing angle with respect to the normal. However, according to the present invention, the different optical microcavities of the white sub-pixel 56 can mutually compensate for this effect. More precisely, the wavelength of the light emitted from each of the commonly-controlled portions 56Y, 56B of the white sub-pixel 56 changes at different viewing angles while the white-point changes of the combined light emission from the commonly-controlled portions 56Y, 56B is smaller than the white-point change due to the wavelength change of at least one of the commonly-controlled microcavity structures 56Y, 56B.

Figure 6:
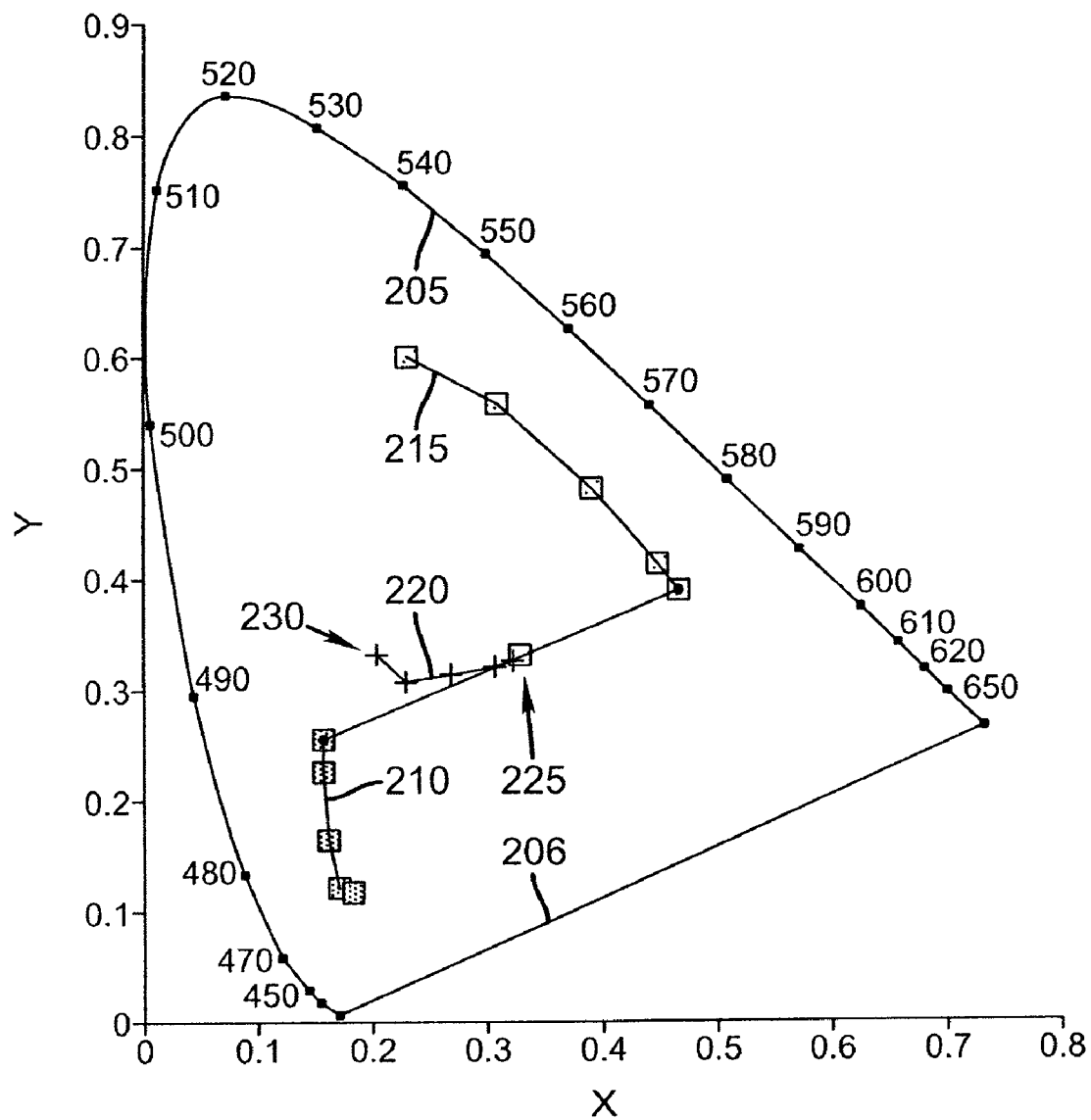
FIG. 6 is a graph illustrating the light emission wavelengths in CIE x and CIE y space of various embodiments of the present invention.

Referring to FIG. 6, a CIE 1931 x,y chromaticity diagram is shown with a spectrum locus 205 illustrating the position of monochromatic light sources, and a purple boundary 206 that includes both red and blue light. The area enclosed by the spectrum locus 205 and the purple boundary 206 includes all visible colors. The light emission 210 of a cyan/blue-emitting optical microcavity (e.g. from optical microcavity 66B) is shown at several increasing angles with respect to the substrate normal, beginning at the normal with x,y coordinates of 0.160, 0.253 and ending at 60 degrees with x,y coordinates of 0.186, 0.116. In particular, note that as the viewing angle of the optical microcavity increases, the perceived color of the light becomes bluer, with a higher frequency and shorter wavelength. Likewise, the light emission 215 of a yellow/green-emitting optical microcavity (e.g. from optical microcavity 66Y) is shown at a plurality of angles. Again, as the viewing angle of the optical microcavity increases, the perceived color of the light becomes greener, with a higher frequency and shorter wavelength, beginning at x,y coordinates of 0.469, 0.389 and ending at x,y coordinates of 0.233, 0.598. Although the light emitted from the individual commonly-controllable portions is colored, since the colors are complementary the combined light appears to be white, having CIE 1931 chromaticity coordinates of 0.267, 0.300 when viewed at 0 degrees viewing angle and 0.1987, 0.246 when viewed at an angle of 60 degrees, shown as curve 220. As the angle of view changes, both the blue and yellow emitters change color significantly. However, the combined color stays relatively constant and substantially white. Point 225 illustrates the white point at a normal angle relative to the substrate and point 230 illustrates the white point at a 60-degree angle relative to the substrate normal. These curves are taken from a real, white-light OLED device constructed by applicants with the change in color at different angles modeled.

Figure 7:
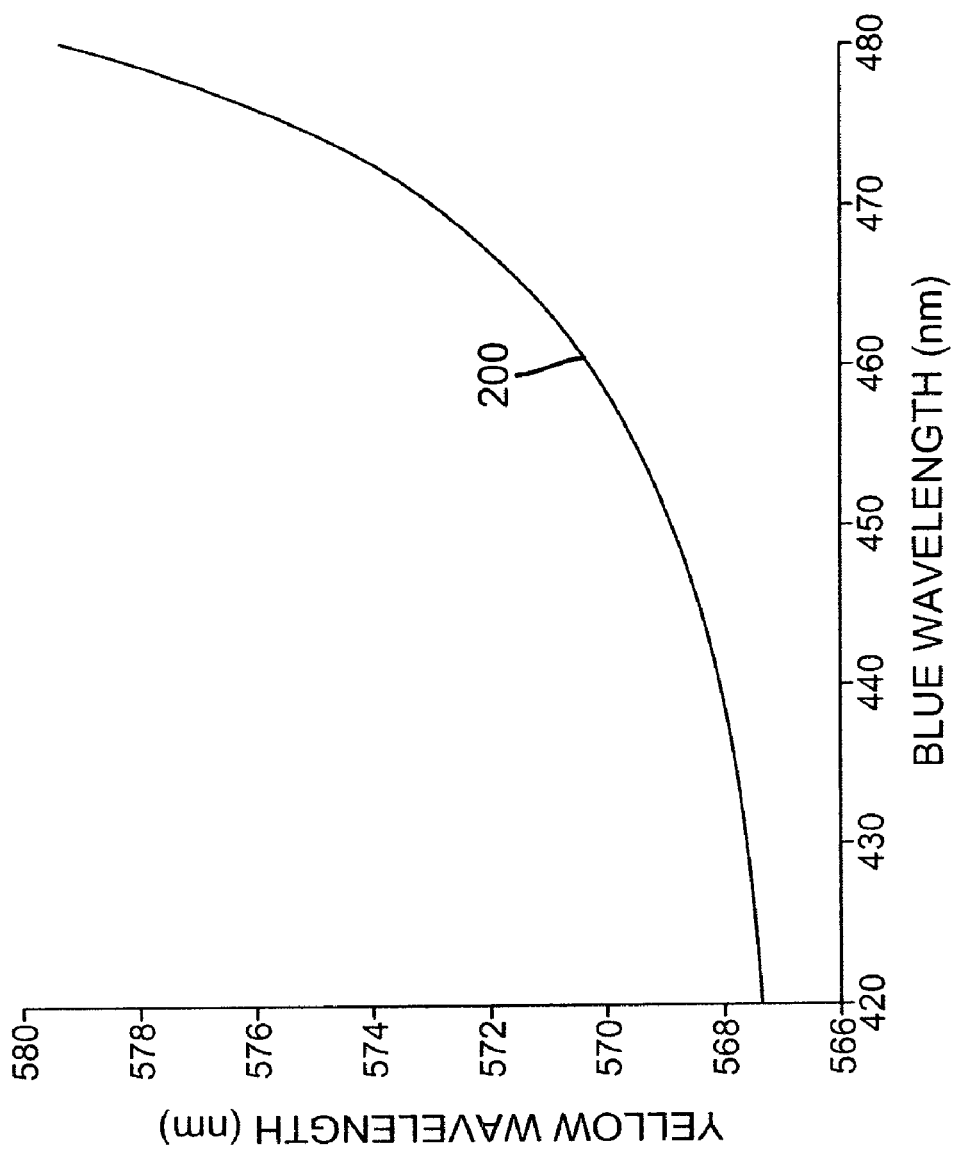
FIG. 7 is a graph illustrating the constant D65 light output for various yellow and blue frequency combinations useful in understanding various embodiments of the present invention.

As can be seen from FIG. 6, the chromaticity coordinates of the white change little in the y dimension while a somewhat larger change is seen in the x dimension. However, the overall change is smaller than that of either of the blue or yellow emitters and the color remains substantially white. Referring to FIG. 7, a graph of a constant D65 white point 200 is shown at different, complementary yellow and blue emission frequencies. As can be seen from FIG. 7, a greater change in the yellow wavelength is required to offset a smaller change in the blue wavelength to maintain the white point. Further, experiments conducted by the applicants have shown that observers are more tolerant of color shifts in white or neutrals towards the blue direction than towards the yellow direction. The emitters shown in FIG. 6 take advantage of these effects by balancing the blue-yellow contributions to minimize the yellow shift while permitting some deviation in the blue direction. This change can be physically controlled by employing a color filter formed over one of the commonly-controlled portions 56Y, 56B that preferentially transmits light emitted at a normal angle with respect to the substrate and preferentially absorbs light emitted at an angle other than the normal. For example, a filter (40WY in FIG. 1) can be employed over the yellow-light-emitting optical microcavity 66Y. The color filter absorbs greenish light having a wavelength less than, for example, 570 nm, 560 nm, or 550 nm. This will have the effect of limiting the movement of the white point to shorter wavelengths or, equivalently, increasing the relative impact of the blue emitters. In alternative embodiments and as modeled by the applicants, a filter (e.g. 40WB in FIG. 1) that absorbs bluish light having a wavelength less than, for example, 500 nm, 490 nm, or 480 nm can be employed.

A large variety of white-light-emitting materials may be employed in concert with the present invention, together with a wide selection of optical cavity sizes, both for the colored sub-pixels 50, 52, 54, and the optical microcavities 66B, 66Y of the white sub-pixel 56. In one embodiment of the present invention, one of the commonly-controlled portions 56Y, 56B of the white sub-pixel 56 emits substantially blue or cyan light at a normal angle with respect to the substrate and another of the commonly-controlled portions emits substantially yellow, orange, or red light at a normal angle with respect to the substrate. One of the commonly-controlled portions of the white sub-pixel 56 emits light having a peak wavelength emission greater than 550 nm at a normal angle with respect to the substrate and another of the at-least-two commonly-controlled portions of the white sub-pixel emits light having a peak wavelength emission less than 500 nm at a normal angle with respect to the substrate. In other embodiments, the optical micro-cavities of the white sub-pixel are tuned to emit red, green, and blue light, or yellow and blue light, or red and cyan light, or orange and cyan light or magenta and green light. In particular, one of the commonly-controlled portions of the white sub-pixel is tuned to emit light having a peak wavelength greater than 550 nm at a normal angle and may include a color filter formed over the commonly-controlled portion of the white sub-pixel, the color filter absorbing a substantial amount of the light having a wavelength less than 550 nm.

Figure 8A:
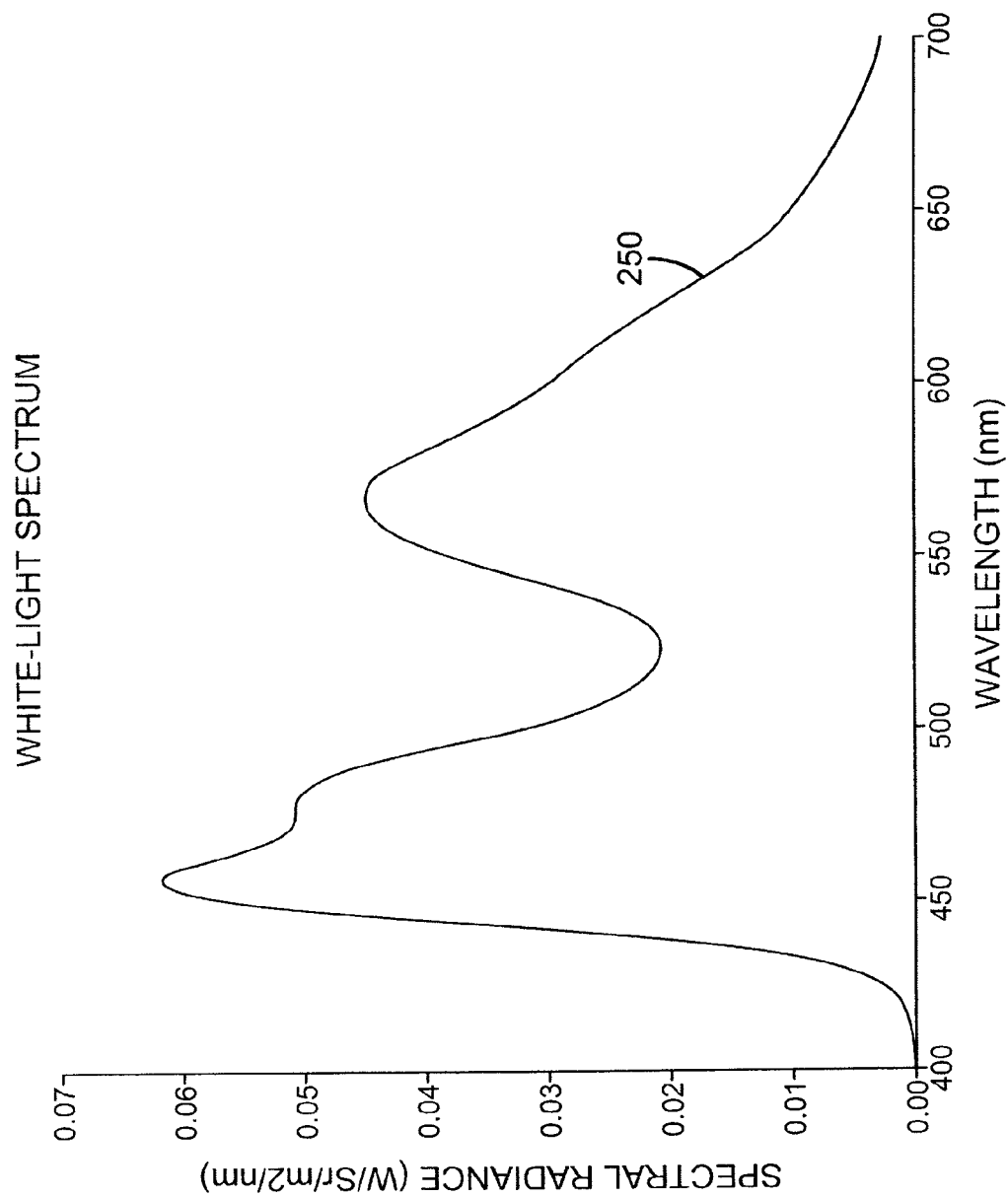
FIG. 8A is a graph illustrating the spectrum of a white emitter at a normal viewing angle without a microcavity structure useful in various embodiments of the present invention.
Figure 8B:
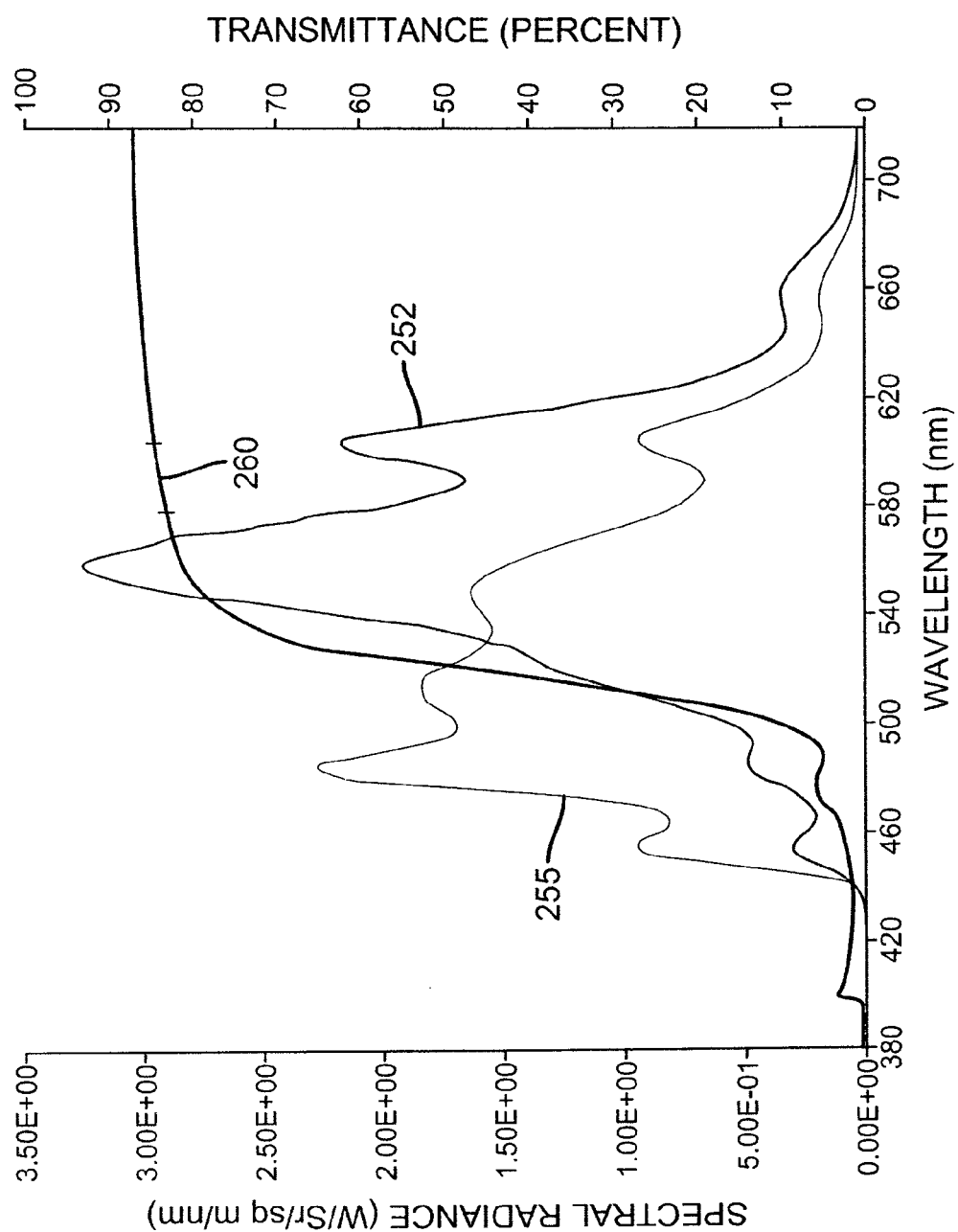
FIG. 8B is a graph illustrating the spectrum of a white emitter with a microcavity at a normal viewing angle and at a different viewing angle together with the spectrum of a color filter useful in various embodiments of the present invention.
Figure 8C:
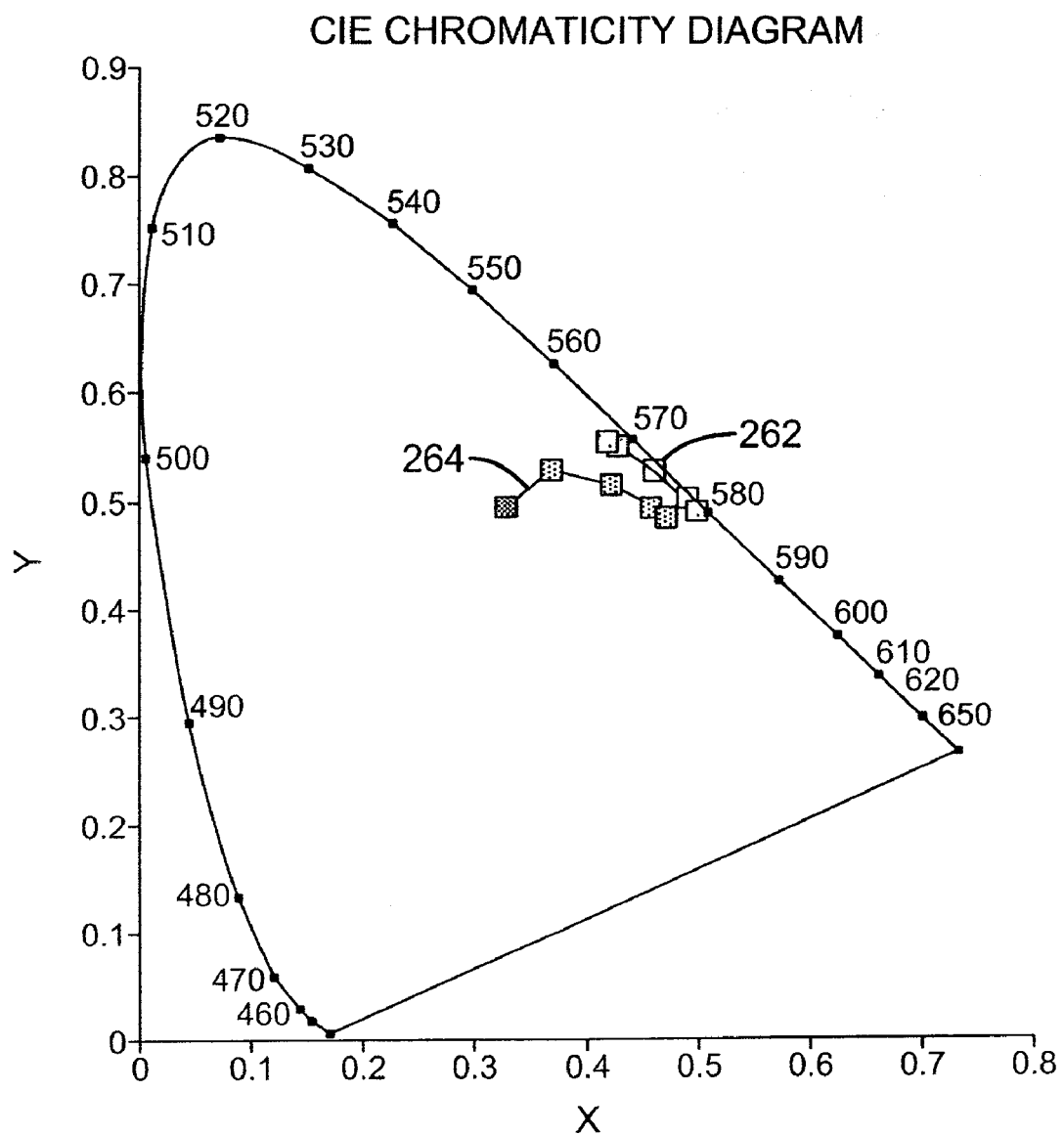
FIG. 8C is a graph illustrating the light emission wavelengths in CIE x and CIE y space of an embodiment of the present invention that incorporates a color filter.
Figure 9:
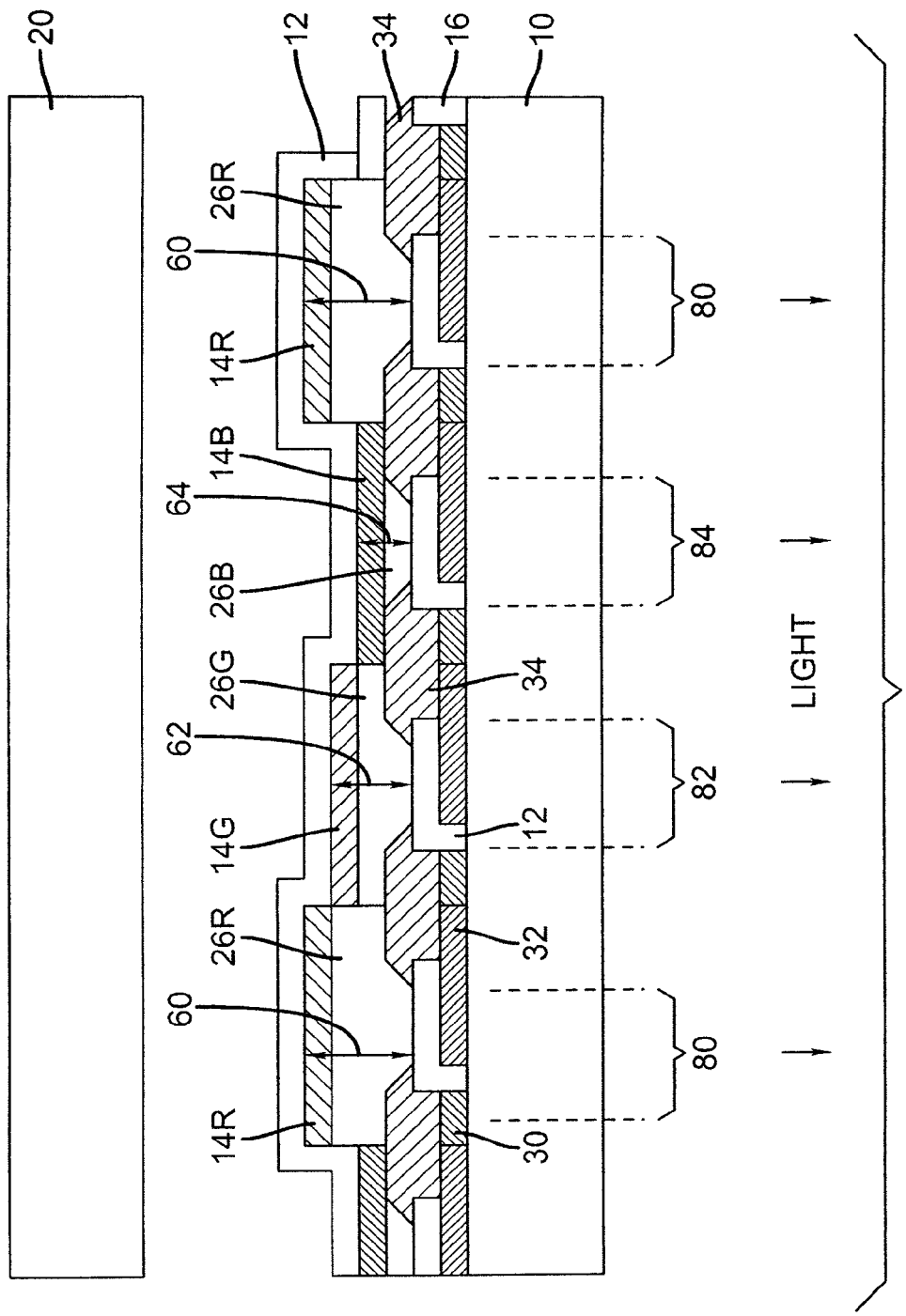
FIG. 9 illustrates a partial cross section of a prior-art bottom-emitter LED device.

A variety of white-light emitters can be employed with the present invention and a variety of microcavities can be formed to create white light-emitting elements from these white-light emitters. For example, FIG. 8A is a graph of the spectrum 250 of a white-light emitter made by applicants useful for the present invention. Referring to FIG. 8B, spectrum 252 is the light output from one microcavity useful as the yellow commonly-controlled portion of the white sub-pixel. As the viewing angle increases, the emission frequency increases, shown by a shifted spectrum 255. By employing a color filter with a high-pass spectrum 260 formed over one of the commonly-controlled portions (e.g. 56Y), light may be preferentially transmitted through the color filter at a normal angle with respect to the substrate and preferentially absorbed by the color filter at an angle other than the normal. Hence, the color shift with viewing angle can be reduced without reducing the amount of light emitted at a normal angle. Referring to FIG. 8C, the color shift with angle at point 264 for a white emitter in a microcavity tuned for yellow emission without a color filter is longer than the color shift with angle at point 262 for a white emitter in a microcavity tuned for yellow emission with a color filter. The color filters (including those of the colored sub-pixels) will, however, reduce the luminance of the device at angles away from the normal. It should be noted, however that the relative luminance efficiency of each portion as well as the chromaticity coordinate of each of the commonly controlled portions of the white sub-pixel will change as a function of viewing angle. In some such devices, using a yellow filter to reduce the luminance of the yellow commonly controlled portion as a function of viewing angle can be useful in maintaining a relatively constant luminance, because the luminance efficiency of the human eye increases as the peak in the yellow moves towards 550 nm.

Figure 10A:
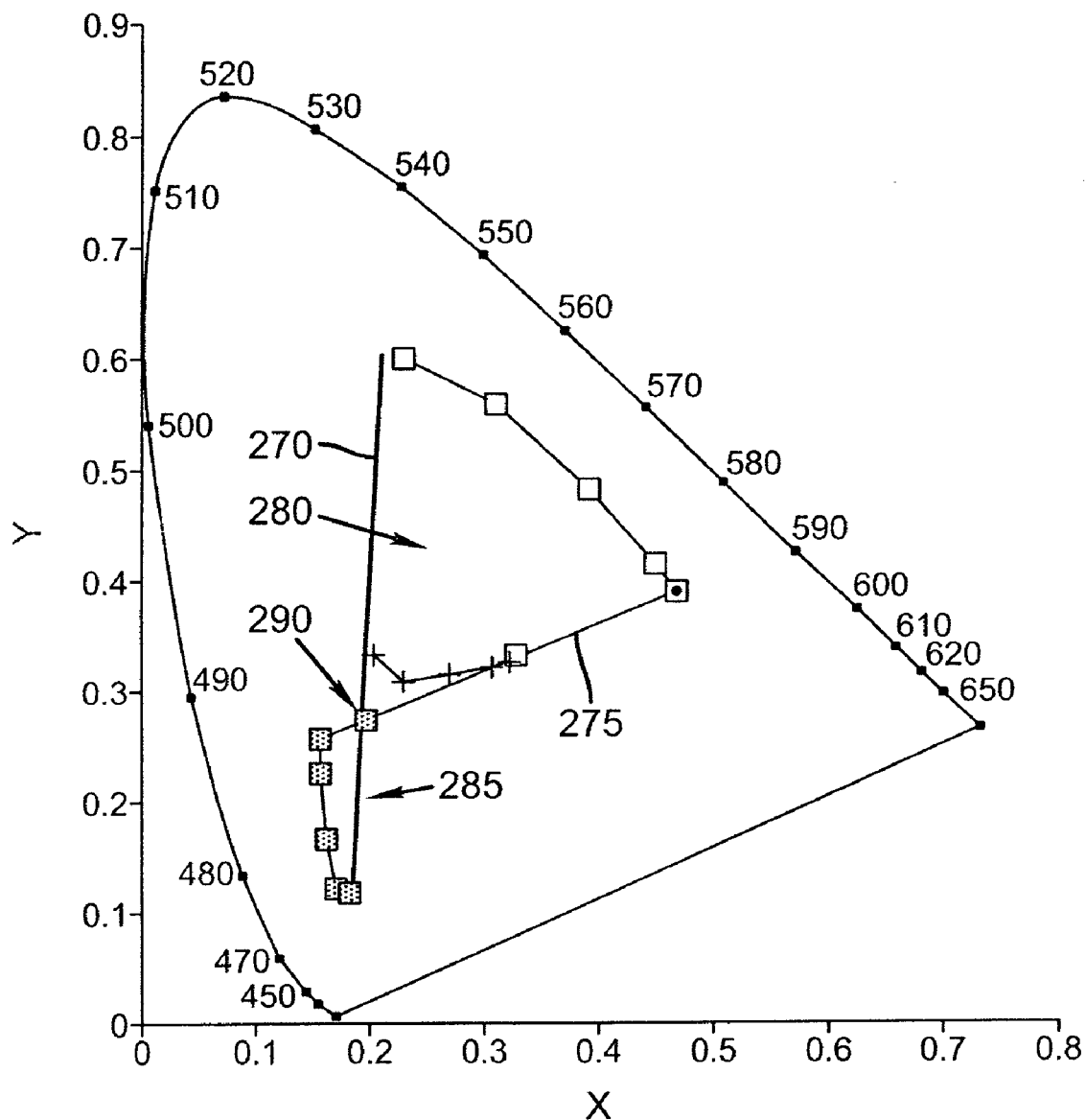
FIGS. 10A and 10B are graphs illustrating the white point variation with viewing angle for a white sub-pixel with different relative sizes of the commonly-controllable portions according to various embodiments of the present invention.
Figure 10B:
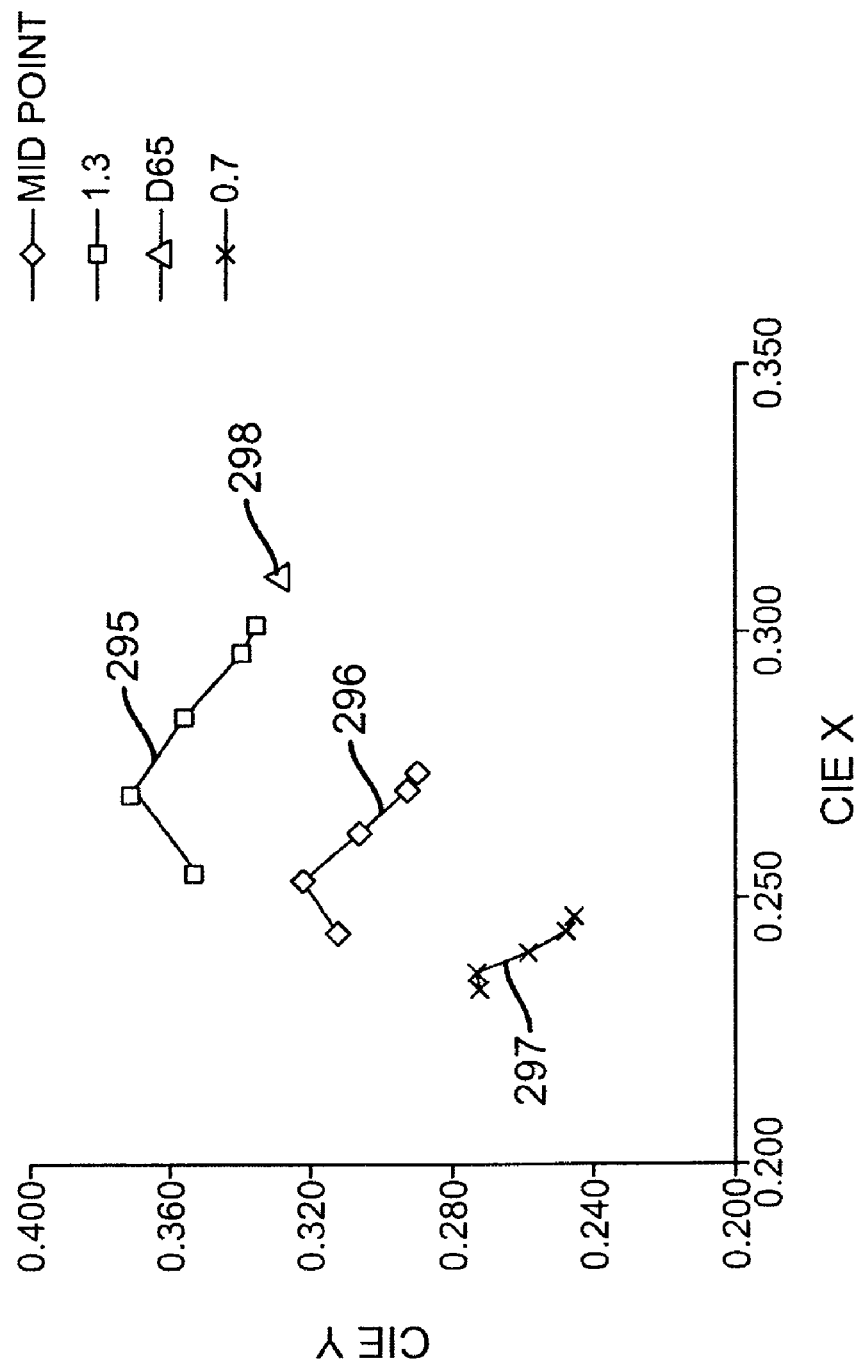

The light emission from devices of the present invention are further controlled by employing differently-sized areas for each of the commonly-controlled portions 56Y, 56B of the white sub-pixel 56. As shown in FIG. 10A, boundary lines 270 and 275 connecting the CIE x and y coordinates of the blue and yellow emitters at the minimum and maximum angles of interest form areas 280 and 285 with a common intersection point at point 290. By changing the relative sizes of the areas of the commonly-controlled portions 56Y, 56B, the relative positions of the white points are moved closer to, or farther from, the intersection point 290. Hence, the amount of change in white point can be reduced as the white points move closer to the intersection point 290. Likewise, the amount of white-point change can be increased as the white points move further from the intersection point 290. Since, in typical organic light-emitting diode systems, yellow emitters are more efficient than blue, it can be advantageous to move the emitters toward the yellow emission points, even if the white points vary more, as long as the white point variation is acceptable. Referring to FIG. 10B, three curves are shown in a CIE x and y graph representing the white point variation from minimum viewing angle to maximum viewing angle for a white-light emitter (a different white-light from that shown in FIGS. 8A-C). The relative sizes of the areas of the yellow 56Y vs. blue 56B commonly-controllable portions are equal for curve 296), 1.3 for curve 295, and 0.7 for curve 297. A D65 white point is shown as point 298. The relative light emission and color shift shown in curve 295 is relatively greater than those of curves 296 or 297.

The light emission from the optical cavities of the present invention are increased by matching the spectrum of the emissive material, the color filter peak transmissions, and the optical microcavity response. That is, the optical cavities of the colored sub-pixels are tuned to an approximate peak wavelength corresponding to the peak transmission wavelength of the corresponding color filter by changing the optical path length of the cavity. Likewise, the optical microcavities of the white sub-pixels are tuned to one or more peak wavelengths approximately corresponding to the peak emission wavelengths of the white-light-emitting layer. Similarly, the peak emission wavelengths of the white-light-emitting layer are matched to the peak transmission wavelength of the corresponding color filter.

However, an overall optimization of the system may require that not all of the light-emitting layer peak emission, peak color filter transmission, and optical cavity peak match. It is also possible that at least one of the commonly-controlled portions 56Y, 56B of the white sub-pixel 56 is tuned to emit light at a peak wavelength different from the peak wavelengths of the colored sub-pixels 50, 52, 54. While the number of manufacturing steps are reduced, if two or more optical cavity sizes are identical (for example, a cavity 64 for a blue-colored sub-pixel and a cavity 66B for a blue-emitting portion 56B of a white sub-pixel 56), it is also possible that an overall system can be optimized, if the optical cavities have different lengths, for example, the white sub-pixel may have a portion cavity tuned to emit a more cyan-colored light than the cavity of a blue-colored sub-pixel.

It may also be possible to design a system in which the normal emission of the white sub-pixel is at a specific white point, such as D65. However, it is possible that the color change with viewing angle or average emission from a desired white point of such a design can be greater than an alternative design in which the emission stays closer to a desired white point or has a reduced change in white point with changing viewing angle, but never actually emits light at the desired white point. Such a design, in which the average performance is superior, may be desired. By average emission is meant the average white point for all of the viewing angles of interest, either weighted or unweighted by importance in an application. Hence, a preferred design may tune the emissions of the white sub-pixel to minimize the difference between the average emission of the white sub-pixel and a preferred device white-point at more than one angle; rather than to match a desired white point at a single viewing angle.

A variety of light-emissive materials are employed in the present invention. For example, the white-light-emitting layer can include organic materials such as small-molecule organic or polymer materials or inorganic quantum dots formed in a poly-crystalline semiconductor matrix. Conventional photolithographic techniques can employed to form control structures (e.g. busses, transistors, capacitors, electrodes) on a substrate as well as forming transparent layers suitable for defining optical cavities. Suitable cavity-defining transparent materials can include, for example, silicon dioxide or indium tin oxide. Organic materials are deposited by various means known in the art, for example, vacuum evaporation. However, such means must provide sufficient precision and accuracy to enable the consistent manufacturing of the optical cavities. In particular, the Kodak Vapor Injection System™ is a linear, organic vacuum evaporation source providing deposition of organic layers to within 1% uniformity and accuracy that may be usefully employed. Suitable semi-transparent cathodes may be formed by evaporation or sputter techniques known in the art, for example of silver, magnesium, aluminum or other metals or metal alloys. These semi-transparent electrodes will typically have a reflectance of greater than 20% and will ideally have an absorbance of less than 10%. Encapsulation techniques for both organic and inorganic materials useful for the present invention are known in the art. The present invention may be employed with various elements, such as circular polarizers (18 in FIG. 1), suitable for improving device ambient contrast ratio. In one embodiment, the present invention is a top-emitter device, as shown in FIG. 1. In an alternative embodiment, (not shown) the device is a bottom-emitter device.

Figure 11:
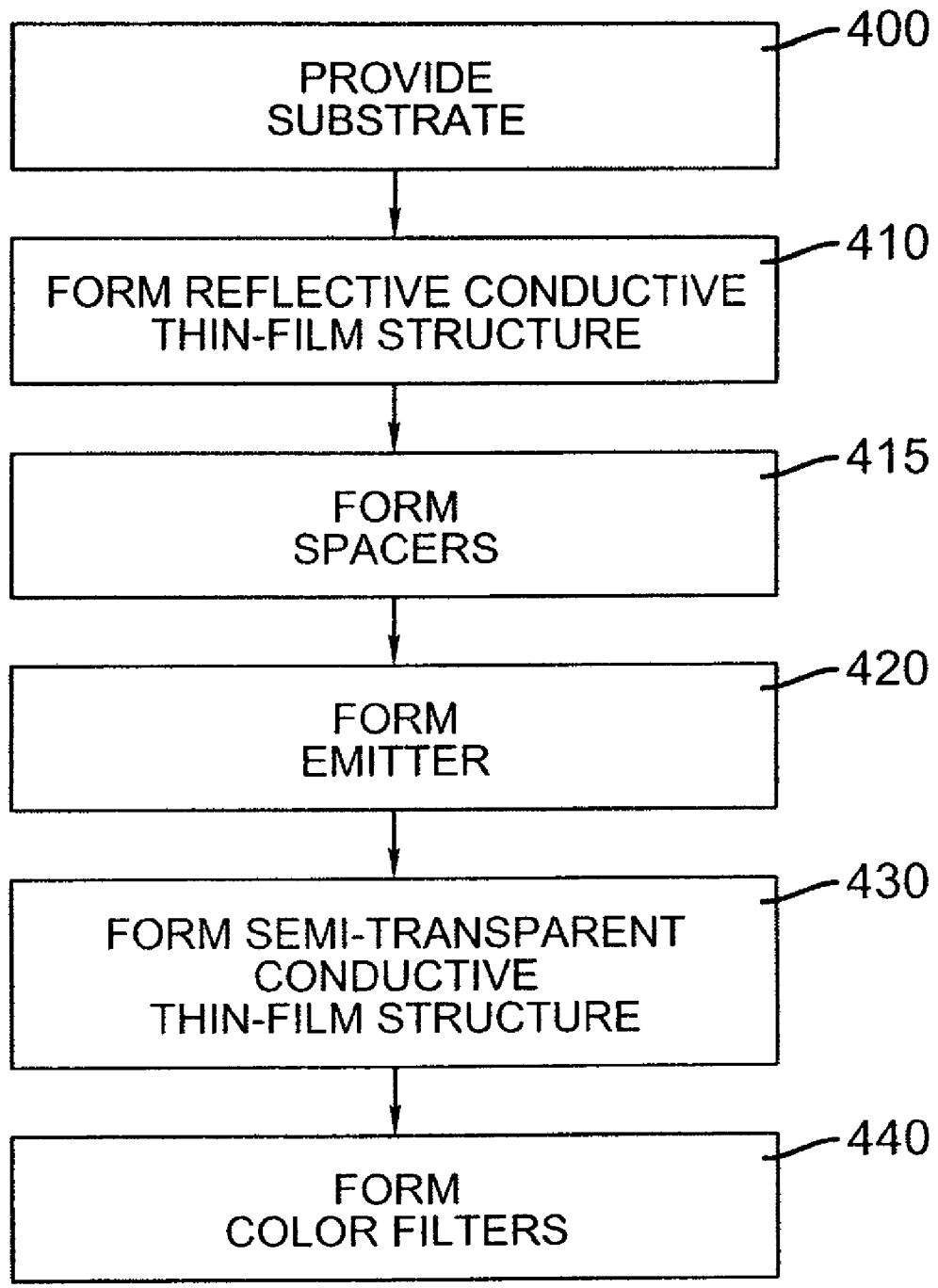
FIG. 11 is a flow chart illustrating a method of making an LED device of the present invention.

Referring to FIG. 11, according to the present invention, a method of making an LED device includes steps: 400 providing a substrate; step 410 forming a reflective conductive thin-film structure, step 415 forming spacers, and step 420 forming an unpatterned white-light-emitting layer over the reflective conductive thin-film structure. A semi-transparent conductive thin-film structure can be formed with step 430 over the reflective conductive thin-film structure so that the unpatterned white-light-emitting layer is formed between the reflective conductive thin-film structure and the semi-transparent conductive thin-film structure. The reflective conductive thin-film structure, semi-transparent conductive thin-film structure, and unpatterned white-light-emitting layer form an optical cavity. Either the reflective or semi-transparent conductive thin-film structure is patterned to form a plurality of independently-controllable light-emitting sub-pixel elements, in step 440; hence optionally forming color filters over a side of the semi-transparent conductive thin-film structure opposite the unpatterned white light-emitting-layer in correspondence with the independently-controllable light-emitting elements to form colored sub-pixels. The color filters have at least two different colors. At least one independently-controllable light-emitting element has at least two commonly-controlled microcavity structures that together emit substantially white light to form a white light-emitting element. The optical cavity of one or more of the commonly controlled microcavity structures of the white light-emitting element includes a plurality of optical microcavities. Each optical microcavity is tuned to emit light at a different complementary wavelength at an emission angle or multiple emission angles. In an alternative embodiment of the present invention, the unpatterned white-light-emitting layer is formed over the semi-transparent conductive thin-film structure.

Through consumer research and optimization of white-light emitters and with carefully selected optical cavity choices, applicants have demonstrated that the color change in white-light emitters using optical microcavities of the present invention are acceptable to consumers. Such microcavity structures have advantages, particularly in top emitter configurations, since a semi-transparent electrode (for example, comprising a thin layer of silver) is much more electrically conductive than a fully transparent electrode (for example, comprising a transparent conductive oxide such as indium tin oxide). The present invention provides improved light output from the microcavity structure, reduced angular color shift, and reduced costs when employing an unpatterned light-emitting layer, either organic or inorganic.

In a patterned device, different materials are employed to emit light of different colors in response to current. In contrast, in an unpatterned device, the same materials are employed to emit a single color, for example, white, and the light emitted by the color sub-pixels is colored by employing color filters in combination with the white-light emitter. Often, a white-light emitter will include a combination of materials in one or more unpatterned layers that each emit a different color, for example, blue and yellow or red and cyan, to emit a light that is perceived, overall, to be white. The important point is that however many light-emitting materials are included in a single layer, or however many layers are included, the layers are unpatterned and their aggregate emission employed in all of the sub-pixels in all of the pixels.

It is known in the prior art that, in LED devices, light can be trapped by total internal reflection in the high-optical-index layers that actually emit light, or high-optical index charge-control layers, or high-optical index transparent electrodes. Light emitted at low angles to the normal can be emitted from the device, while light emitted at a relatively higher angle to the normal can be trapped in the high-optical-index layers. By employing an optical cavity structure, the emission of light at high angles is reduced so that more light is emitted from the device at relatively lower angles to the normal.

It is also true that the color of light emitted from optical cavity structures has a dependence on the viewing angle. This angular dependence can be extremely irritating to viewers, in particular for applications in which a large viewing angle is valued. This color shift with angle is especially noticeable for color sub-pixels using a white-light emitter. However, the color filters employed in the present invention for the color sub-pixels not only absorb ambient light, they also reduce the observed dependence on angle of the light color that one normally has with an optical cavity device.

However, the color shift reduction found with increasing angle for the color sub-pixels provided by the present invention does reduce the luminance of these color sub-pixels. Such a reduction in luminance is less noticeable and objectionable to viewers than a shift in color. Moreover, to the extent that the color sub-pixels decrease in luminance, while the luminance of the white sub-pixels is constant (although a white-point shift may occur) as a result of changing viewing angle, the net effect may be a reduction in overall color saturation. Such a color saturation reduction is negligible for some images (i.e. those images with little saturated color) and less noticeable than a change in color for those images with strongly saturated colors. Hence, improved image quality is obtained. Moreover, since most images are relatively unsaturated, the net luminance effect is often relatively minor.

Applicants have constructed numerous OLED devices employing microcavities, both with patterned, colored emitters and with white emitters and have studied their performance together with the performance of circular polarizers and color filters. Moreover, optical modeling tools have been employed to understand the performance of the present invention under a variety of circumstances. In general, a white-light-emitting, unpatterned OLED device employing an optical cavity and color filters can be expected to roughly double the light output of the colored pixels in comparison to a white-light-emitting, unpatterned OLED device without an optical cavity and color filters. The color sub-pixels will increase in light output the most, while the white-light-emitting sub-pixel will only change in light output by a multiplicative factor of roughly 0.6 to 1.2, since it is more difficult to increase broadband light output than narrow-band light in an optical cavity structure. However, since the white-light-emitting sub-pixel is more efficient (by about a factor of three) than the color sub-pixels (since no color filters are employed in the white sub-pixel), the use of a white sub-pixel improves the overall performance of an OLED device as most images have few saturated colors and the more-efficient white-light emitter is used disproportionately. Applicants have demonstrated that the use of such a white sub-pixel in a color filter design can improve the overall device performance by a factor of approximately two for some imaging applications.

LED devices of this invention can employ various well-known optical effects in order to enhance their properties if desired. This includes optimizing layer thicknesses to yield maximum light transmission, providing dielectric mirror structures, providing anti-glare or anti-reflection coatings over the display, providing neutral density, or providing color conversion filters over the display. Filters, polarizers, and anti-glare or anti-reflection coatings can be specifically provided over or as part of the cover or substrate.

The present invention can be practiced with either active- or passive-matrix OLED devices, and is particularly useful in information-display devices. In one embodiment, the present invention is employed in a flat-panel OLED device composed of small-molecule or polymeric OLEDs as disclosed in, but not limited to, U.S. Pat. No. 4,769,292, issued Sep. 6, 1988 to Tang et al., and U.S. Pat. No. 5,061,569, issued Oct. 29, 1991 to VanSlyke et al. Inorganic devices, for example, employing quantum dots formed in a polycrystalline semiconductor matrix (for example, as taught in US Publication 2007/0057263 by Kahen), and employing organic or inorganic charge-control layers, or hybrid organic/inorganic devices can be employed. Many combinations and variations of organic or inorganic light-emitting displays can be used to fabricate such a device, including both active- and passive-matrix displays having either a top- or bottom-emitter architecture.

The invention has been described in detail with particular reference to certain preferred embodiments thereof, but it will be understood that variations and modifications can be effected within the spirit and scope of the invention.

PARTS LIST 10 substrate
11 reflective layer
12 reflective conductive thin-film structure
13, 13R, 13G, 13B, 13WY, 13WB spacer
14 light-emitting layer(s)
14R, 14G, 14B patterned light-emitting layers
15 transparent conductive layer
16 semi-transparent conductive thin-film structure
18 circular polarizer
20 cover
26 spacers
26R, 26G, 26B, 26WY, 26WB spacer
28 microcavity structures
28A, 28B, 28C, 28D, 28E, 28F microcavity structures
29 A, 29B frequency of light
30 thin-film circuitry
32 insulator
34 insulator
40R, 40G, 40B, 40WY, 40WB color filter
40K black matrix
50, 52, 54, 56 light-emitting elements, sub-pixels
56Y, 56B commonly-controllable portions
60, 62, 64, 66, 66B, 66Y optical cavity
80, 82, 84 light
200 D65 white point
205 spectrum locus
206 purple boundary
210 blue emission curve
215 yellow emission curve
220 white point curve
225 white point at normal viewing angle
230 white point at maximum viewing angle
250 white emission spectrum
252 spectrum
255 shifted white emission spectrum
260 color filter transmission spectrum
262 color shift with angle
264 color shift with angle
270 boundary line
275 boundary line
280 region
285 region
290 intersection
295 emission curve
296 emission curve
297 emission curve
298 D65 white point
300 device
310 controller
320 signal
400 process step: provide substrate
410 process step: form electrode
415 process step: form spacers
420 process step: form unpatterned white-light-emitting layer
430 process step: form semi-transparent electrode
440 process step: form color filters

The invention claimed is:

1. A thin-film, white-light-emitting diode device, including:
   a) a reflective, conductive thin-film structure and a semi-transparent, conductive thin-film structure;
   b) one or more thin-film layers formed between the reflective and semi-transparent conductive thin-film structures forming only two commonly-controlled microcavity structures, the thin-film layer(s) emitting white light in response to current provided by the conductive thin-film structure;
   c) wherein each of the two commonly-controlled microcavity structures has a different resonant frequency within one of the optical cavities and emits light with a smaller spectral range than the spectral range of the white-light-emitting thin-film layer(s), a combination of light emitted from the two commonly-controlled microcavity structures is white; and
   d) wherein light emitted by the one of the two commonly-controlled microcavity structures is blue and light emitted by the other of the commonly-controlled microcavity structures is yellow, or light emitted by one of the commonly-controlled microcavity structures is cyan and the light emitted by the other of the commonly-controlled microcavity structures is red, or light emitted by one of the commonly-controlled microcavity structures is green and the light emitted by the other of the commonly-controlled microcavity structures is magenta.

2. The thin-film, white-light-emitting diode device of claim 1 further including one or more additional, independently-controlled structures that emit light.

3. The thin-film, white-light-emitting diode device of claim 1 further comprising color filters that filter light emitted by the white-light-emitting thin-film layer.

4. The thin-film, white-light-emitting diode device of claim 1, wherein a color change of the combined light emitted by the two commonly-controlled microcavity structures over one or more angles is less than a color change of the light emitted by at least one of the two commonly-controlled microcavity structures over the one or more angles.

5. The thin-film, white-light-emitting diode device of claim 1 wherein the reflective, conductive thin-film structure or the semitransparent, conductive thin-film structure comprise a single layer of metal.

6. The thin-film, white-light-emitting diode device of claim 1 wherein the reflective, conductive thin-film structure includes a reflective layer and a separate transparent, conductive layer.

7. The thin-film, white-light-emitting diode device of claim 6 wherein a transparent spacer layer is located between the reflective layer and the separate transparent, conductive layer.

8. The thin-film, white-light-emitting diode device of claim 1 wherein a transparent spacer layer is located between the reflective, conductive thin-film structure and the semi-transparent, conductive thin-film structure.

9. The thin-film, white-light-emitting diode device of claim 1 further comprising two pairs of commonly-controlled microcavity structures, each pair of microcavity structures emitting light having a smaller spectral range than the spectral range of the white-light-emitting thin-film layer(s), the combination of light emitted by the pairs of commonly-controlled microcavity structures is white.

10. The thin-film, white-light-emitting diode device of claim 9 wherein light emitted by one of a pair of commonly-controlled microcavity structures is blue and light emitted by the other of the pair of commonly-controlled microcavity structures is yellow, or light emitted by one of a pair of microcavity structures is cyan and the light emitted by the other of the pair of commonly-controlled microcavity structures is red, or light emitted by one of a pair of commonly-controlled microcavity structures is green and the light emitted by the other of the pair of commonly-controlled microcavity structures is magenta.

11. The thin-film, white-light-emitting diode device of claim 10 further comprising three pairs of commonly-controlled microcavity structures, each pair producing complementary colors of light.

12. The thin-film, white-light-emitting diode device of claim 1 wherein the commonly-controlled microcavity structures are located adjacent each other over a substrate.

13. The thin-film, white-light-emitting diode device of claim 1 further comprising transparent spacer layers employed to form one or more optical cavities.

14. The thin-film, white-light-emitting diode device of claim 1, wherein the thin-film, white-light-emitting diode device is a display device, a lamp device, or an area illumination device.

15. The thin-film, white-light-emitting diode device of claim 1, further comprising a controller to control and provide power to the thin-film, white-light-emitting diode device.

16. A method of forming the thin-film, white-light-emitting diode device of claim 1.

17. A thin-film, light-emitting diode device, including:
  a) a reflective, conductive thin-film structure and a semi-ransparent, conductive thin-film structure;
  b) one or more thin-film layers formed between the reflective and semi-transparent conductive thin-film structures forming only two commonly-controlled microcavity structures, the thin-film layer(s) emitting light in response to current provided by the conductive thin-film structures;
  c) wherein each of the two commonly-controlled microcavity structures emits light having a smaller spectral range than the spectral range of the light-emitting thin-film layer(s), and a color change of the combined light emitted by the commonly-controlled microcavity structures over one or more angles is less than the color change of the light emitted by at least one of the commonly-controlled microcavity structures over the one or more angles; and
  d) wherein light emitted by the one of the two commonly-controlled microcavity structures is blue and light emitted by the other of the commonly-controlled microcavity structures is yellow, or light emitted by one of the commonly-controlled microcavity structures is cyan and the light emitted by the other of the commonly-controlled microcavity structures is red, or light emitted by one of the commonly-controlled microcavity structures is green and the light emitted by the other of the commonly-controlled microcavity structures is magenta.

18. The thin-film, light-emitting diode device of claim 17, wherein the light-emitting thin-film layer is patterned such that different light-emitting materials are employed within different commonly-controlled microcavity structures.

* * * * *